US012695457B2

(12) United States Patent
Yang et al.

(10) Patent No.: US 12,695,457 B2
(45) Date of Patent: Jul. 28, 2026

(54) SYNCHRONOUS TRANSMISSION METHOD, AND CHIP AND SERIAL COMMUNICATION SYSTEM APPLYING THE SAME

(71) Applicant: Silergy Semiconductor Technology (Hangzhou) LTD, Hangzhou (CN)

(72) Inventors: Yuanyu Yang, Hangzhou (CN); Xiaoqiang Xu, Hangzhou (CN); Jianxin Wang, Hangzhou (CN)

(73) Assignee: Silergy Semiconductor Technology (Hangzhou) LTD., Hangzhou (CN)

( * ) Notice: Subject to any disclaimer, the term of this patent is extended or adjusted under 35 U.S.C. 154(b) by 117 days.

(21) Appl. No.: 18/926,400

(22) Filed: Oct. 25, 2024

(65) Prior Publication Data

US 2025/0150085 A1     May 8, 2025

(30) Foreign Application Priority Data

Nov. 3, 2023     (CN) .......................... 202311459388.7

(51) Int. Cl.
*H03L 7/00* (2006.01)
*G06F 13/42* (2006.01)

(52) U.S. Cl.
CPC ............ *H03L 7/00* (2013.01); *G06F 13/4282* (2013.01); *G06F 2213/0002* (2013.01)

(58) Field of Classification Search
None
See application file for complete search history.

(56) References Cited

U.S. PATENT DOCUMENTS

| | | | |
|---|---|---|---|
| 10,356,824 B2 | 7/2019 | Qiao et al. | |
| 12,525,173 B2 * | 1/2026 | Cai ........................... | G06F 3/14 |
| 2023/0179668 A1 | 6/2023 | Lin et al. | |

* cited by examiner

*Primary Examiner* — Cassandra F Cox

(57) ABSTRACT

A method of synchronous transmission for a serial communication system having a master device and a plurality of slave devices coupled in series, can include: in a synchronous control interval of a control period, controlling an output signal of a corresponding slave according to an input signal of the corresponding slave; in a data control interval of the control period, controlling the output signal of the corresponding slave according to a first signal, such that a period of the output signal is synchronized with a period of the input signal; and where a start moment of a first period of the first signal is delayed by a first duration compared to a start moment of a first period of the input signal.

20 Claims, 6 Drawing Sheets

SYNCHRONOUS TRANSMISSION METHOD, AND CHIP AND SERIAL COMMUNICATION SYSTEM APPLYING THE SAME

RELATED APPLICATIONS

This application claims the benefit of Chinese Patent Application No. 202311459388.7, filed on Nov. 3, 2023, which is incorporated herein by reference in its entirety.

FIELD OF THE INVENTION

The present invention generally relates to the field of communications, and more particularly, to synchronization transmission methods and serial communication systems.

BACKGROUND

Single-wire serial communication offers several advantages, including fewer communication ports, low power consumption, compact packaging, and simple design, and is widely used in automatic control systems, industrial control, smart homes, and intelligent transportation. In current technologies, when using single-wire serial communication, the internal clock of each slave is typically used for reply and synchronization. The input signal of the slave is asynchronous with its internal clock, usually resulting in a delay of one to two cycles between the output and input signals of the slave. Additionally, the delay can vary between different edges. After multiple stages of cascading, the high or low levels of the transmitted signal and the duty cycle can change to varying degrees, which can lead to transmission errors.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
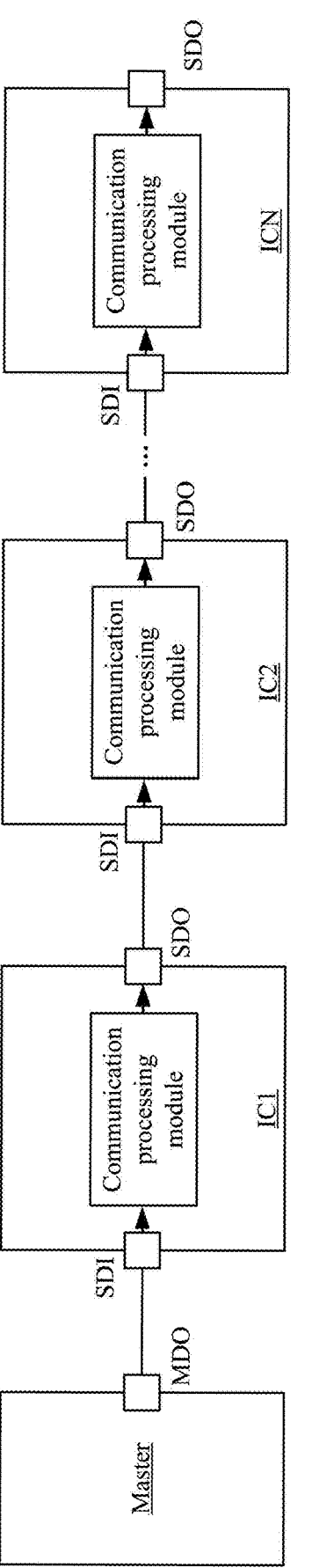
FIG. 1 is a schematic block diagram of an example serial communication system, in accordance with embodiments of the present invention.

Referring now to FIG. 1, shown is a schematic block diagram of an example serial communication system, in accordance with embodiments of the present invention. This particular example serial communication system can include N slaves (e.g., chips) IC1-ICN and a master coupled in series in turn, where N is a positive integer. Each slave can include input terminal SDI and output terminal SDO, and input terminal SDI of slave IC1 among the slaves and connect to output terminal MDO of the master. Input terminal SDI of each of slaves IC2-ICN can connect to output terminal SDO of a previous slave, respectively. Input terminal SDI of each slave can receive an input signal, and output terminal SDO of each slave may provide an output signal.

Each slave can also include a communication processing module that can be coupled between input terminal SDI and output terminal SDO of the slave, and may generate the output signal. In a synchronous control interval of each of the control periods, the output signal can be controlled by the input signal, In a data control interval of each of the control periods, the output signal can be controlled by a first signal, such that a period of the output signal is synchronized with a period of the input signal. A start moment of a first period of the first signal may be delayed by a first duration compared to a start moment of a first period of the input signal. For example, the first duration can be greater than $k$ times the period of the input signal and less than $(k+0.5)$ times the period of the input signal, where $k$ is an integer and not less than zero. For example, $k=1$; that is, the first duration is greater than the period of the input signal and less than 1.5 times the period of the input signal. Particular embodiments are described herein with the first duration being greater than the period of the input signal and less than 1.5 times the period of the input signal as an example, but $k$ may be 0, 2, 3, . . . , and so on, in certain embodiments.

Each communication processing module can include a data processing module that generates the first signal. The first signal may represent data that the slaves are intended to output; that is, the first signal determines whether the data of the output signal is 0 or 1. The data of the input signal and the output signal (or the first signal) may be either related or unrelated. For example, the communication processing module can forward or process and then forward communication data packets or commands from the input signal received by a corresponding slave. The processing of the communication data packets can include modifying relevant data in the communication data packets to generate the output signal. In another example, the communication processing modules may output signals with consistent data, irrespective of the input signal's data. In one embodiment, the master and the slaves (IC1-ICN) can connect in series through a single-line bus. In one embodiment, output terminal SDO of the Nth slave ICN may not be connected to an input terminal of the master, as long as one-way data transmission is achieved, without forming a circular serial communication. In another embodiment, output terminal SDO of the Nth slave ICN can connect to the input terminal of the master to form the circular serial communication.

Figure 2:
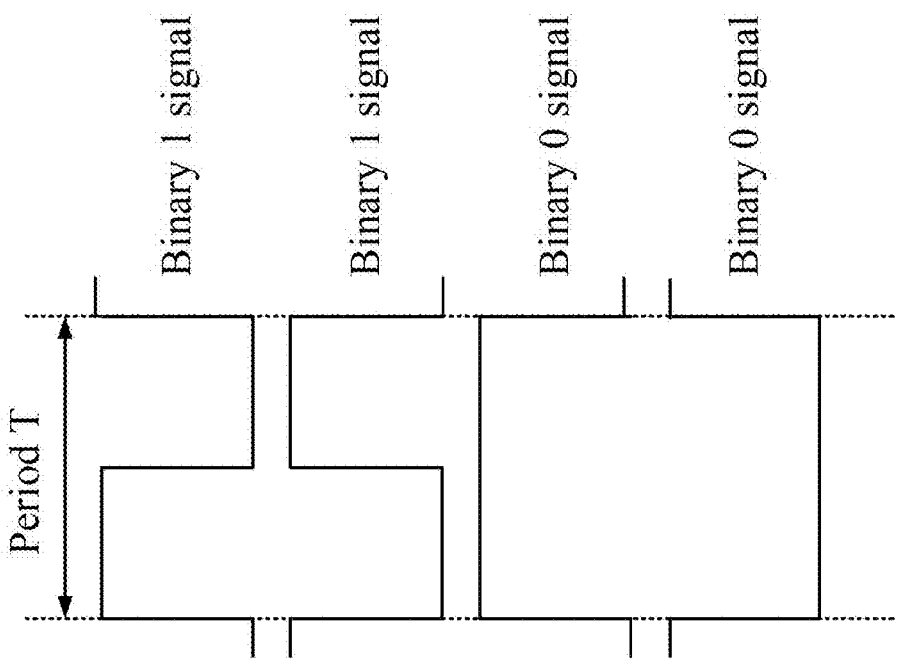
FIG. 2 is a waveform diagram of example operation of two different signals, in accordance with embodiments of the present invention.

Referring now to FIG. 2, shown is a waveform diagram of example operation of two different signals, in accordance with embodiments of the present invention. Here, the two different signals are a binary 0 signal and a binary 1 signal. In this particular example, the binary 0 signal maintains either a high level or a low level in one period T (e.g., one data frame) without any pulse transition (e.g., no level inversion). In contrast, the binary 1 signal can include both high and low levels within one period T (e.g., one data frame) and exhibits pulse transition (e.g., there is level inversion), which can occur from high level to low level or low level to high level. The duty cycle of the binary 1 signal is not limited in certain embodiments. In one embodiment, the pulse transition can occur at both the start moment and the end moment of each period of each signal.

Figure 3:
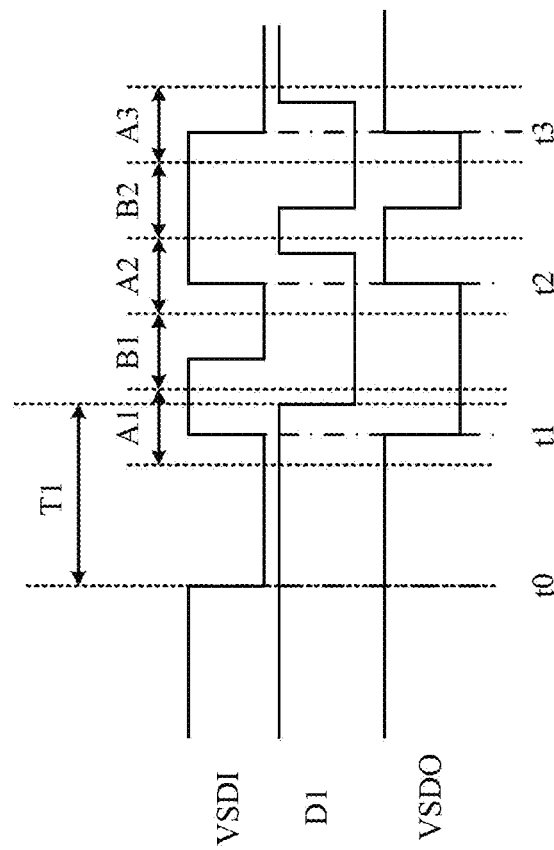
FIG. 3 is a waveform diagram of an example method of synchronous transmission, in accordance with embodiments of the present invention.

Referring now to FIG. 3, shown is a waveform diagram of an example method of synchronous transmission, in accordance with embodiments of the present invention. Here, VSDI may represent the input signal, D1 may represent the first signal, VSDO may represent the output signal, Ai may represent the synchronous control interval in an i-th control period, Bi may represent the data control interval in the i-th control period, and T1 may represent the first duration.

In this particular example, each control period can correspond to one period of input signal VSDI. In one embodiment, the first control period can correspond to the second period (t1-t2 interval) of input signal VSDI, the second control period can correspond to the third period (t2-t3 interval) of input signal VSDI, and so on, and the i-th control period can correspond to the (i+1)th period of input signal VSDI. In other embodiments, the i-th control period can correspond to the i-th period of input signal VSDI. A start moment of the first period of the first signal may be delayed by duration T1 compared to a start moment of the first period of the input signal.

A start moment of synchronous control interval A1 in the first control period can be before a start moment t1 of the second period of input signal VSDI, and an end moment of synchronous control interval A1 may be between start moment t1 of the second period of input signal VSDI and a middle point of the second period of input signal VSDI. A start moment of synchronous control interval A2 in the second control period can be before start moment t2 of the third period of input signal VSDI, and an end moment of synchronous control interval A2 may be between start moment t2 of the third period of input signal VSDI and a middle point of the third period of input signal VSDI. As such, a start moment of one synchronous control interval can be before a start moment of a corresponding period of the input signal, and an end moment of the synchronous control interval may be between the start moment of the corresponding period of the input signal and a middle point of the corresponding period of the input signal.

A start moment of the data control interval B1 in the first control period can be between start moment t1 of the second period of input signal VSDI and a middle point of the second period of input signal VSDI, and an end moment of data control interval B1 may be between the middle point of the second period of input signal VSDI and end moment t2 of the second period of input signal VSDI. A start moment of data control interval B2 in the second control period can be between start moment t2 of the third period of input signal VSDI and a middle point of the third period of input signal VSDI, and an end moment of data control interval B2 may be between the middle point of the third period of input signal VSDI and end moment t3 of the third period of input signal VSDI. In one embodiment, the end moment of the second period of input signal VSDI and the start moment of the third period of input signal VSDI can be the same. As such, a start moment of one data control interval can be between a start moment of a corresponding period of the input signal and a middle point of the corresponding period of the input signal, and an end moment of the data control interval may be between the middle point of the corresponding period of the input signal and an end moment of the corresponding period of the input signal.

In addition, each communication processing module can control a level relationship between the output signal and the input signal in the synchronous control interval based on levels of the input signal and at least one of the first signal and the output signal before a start moment of the synchronous control interval. Alternatively, each communication processing module can control a level relationship between the output signal and the input signal in the synchronous control interval based on pulse transitions of the input signal and at least one of the first signal and the output signal in the synchronous control interval.

In particular embodiments, each communication processing module can generate the output signal in the following four manners. In a first manner, before the start moment of the synchronous control interval, the level of the input signal and the level of the first signal can be sampled. When the level of the input signal is the same as the level of the first signal, the level of the output signal can be the same as the level of the input signal in the synchronous control interval. Also, when the level of the input signal is opposite to the level of the first signal, the level of the output signal can be opposite to the level of the input signal in the synchronous control interval.

In a second manner, before the start moment of the synchronous control interval, the level of the input signal and the level of the output signal can be sampled. When the level of the input signal is the same as the level of the output signal, the level of the output signal may be the same as the level of the input signal in the synchronous control interval. Also, when the level of the input signal is opposite to the level of the output signal, the level of the output signal can be opposite to the level of the input signal in the synchronous control interval.

In a third manner, in the synchronous control interval, when the pulse transition of the input signal is the same as the pulse transition of the first signal (which can occur from high level to low level transitions, or low level to high level transitions), the level of the output signal can be the same as the level of the input signal in the synchronous control interval. Also, when the pulse transition of the input signal is opposite to the pulse transition of the first signal, the level of the output signal may be opposite to the level of the input signal in the synchronous control interval.

In a fourth manner, in the synchronous control interval, when the pulse transition of the input signal is the same as the pulse transition of the output signal, the level of the output signal can be the same as the level of the input signal in the synchronous control interval. Also, when the pulse transition of the input signal is opposite to the pulse transition of the output signal, the level of the output signal may be opposite to the level of the input signal in the synchronous control interval. The level of the output signal can be the same as the level of the first signal in each data control interval.

In one embodiment, both the input signal and the output signal can be at a high level when it is not operating. In other embodiments, the input signal and the output signal may be at a low level when it is not operating. In one example, the end moment of a synchronous control interval and the start moment of a corresponding data control interval following the synchronous control interval can be the same. In other examples, the synchronous control interval and the corresponding data control interval following the synchronous control interval may be separated by a certain period of time. In one embodiment, duration T1 can be greater than the period of the input signal but less than 1.5 times the period of the input signal. However, any example whereby duration T1 is greater than k times the period of the input signal and is less than (k+0.5) times the period of the input signal, where k is an integer and not less than zero, is supported in certain embodiments.

The first manner can be combined with FIG. 3, in order to illustrate the operating principle of the communication processing module. The first period of input signal VSDI spans from t0 to t1, and is to enter synchronous control interval A1 before the start moment t1 of the second period of input signal VSDI (or, before the end moment t1 of the first period of input signal VSDI). Before the start moment of synchronous control interval A1, input signal VSDI can be at a low level, while signal D1 is at a high level. As such, the levels of input signal VSDI and signal D1 can be opposite, such that the level of output signal VSDO is opposite to the level of input signal VSDI in synchronous control interval A1. Then, data control interval B1 can be entered, whereby the level of output signal VSDO is the same as the level of signal D1. Before the start moment of synchronous control interval A2, both input signal VSDI and signal D1 can be at a low level. As such, the levels of input signal VSDI and signal D1 can be same, such that the level of output signal VSDO is the same as the level of input signal VSDI in synchronous control interval A2. Then, data control interval B2 can be entered, whereby the level of output signal VSDO is the same as the level of signal D1. In this way, synchronous control intervals and data control intervals of the control periods can alternately be arranged based on a time sequence, thus ensuring that during the synchronous control intervals, the periods of the input and output signals are synchronized, and during the data control intervals, the data that the slaves are to output is generated, thereby generating the output signals.

The serial communication system of particular embodiments can include multiple chips connected in series, and may utilize single-wire communication to transmit large amounts of data. By employing synchronous or near-synchronous methods, the serial communication system can achieve reduced data transmission time. Particular embodiments may address the issue of periodic synchronization in communication system including multiple chips connected in series during single-wire communication. The communication processing module can generate the output signal based on the input signal during the synchronous control intervals and based on the first signal during the data control intervals.

For example, the start moment of each period of the output signal (e.g., the pulse edge indicating the beginning of the period) can be controlled by the input signal, while whether the data of the output signal is 0 or 1 (e.g., whether a level transition occurs within a period) may be controlled by the first signal. Synchronous control and data control may alternate in sequence, thus ensuring that the period of the output signal aligns with the period of the input signal (e.g., achieving synchronization). The data of a period of the output signal can be the same as the data of the corresponding period of the first signal, thus making the output signal a periodically corrected version of the first signal. Moreover, the synchronous transmission method of particular embodiments can achieve synchronization using a lower clock frequency inside the chip, thus reducing digital power consumption and chip area, and ultimately lowering chip costs. Further, the communication processing module can also include a synchronous transmission circuit, and the synchronous transmission circuit can generate the output signal based on the first signal and the input signal.

Figure 4:
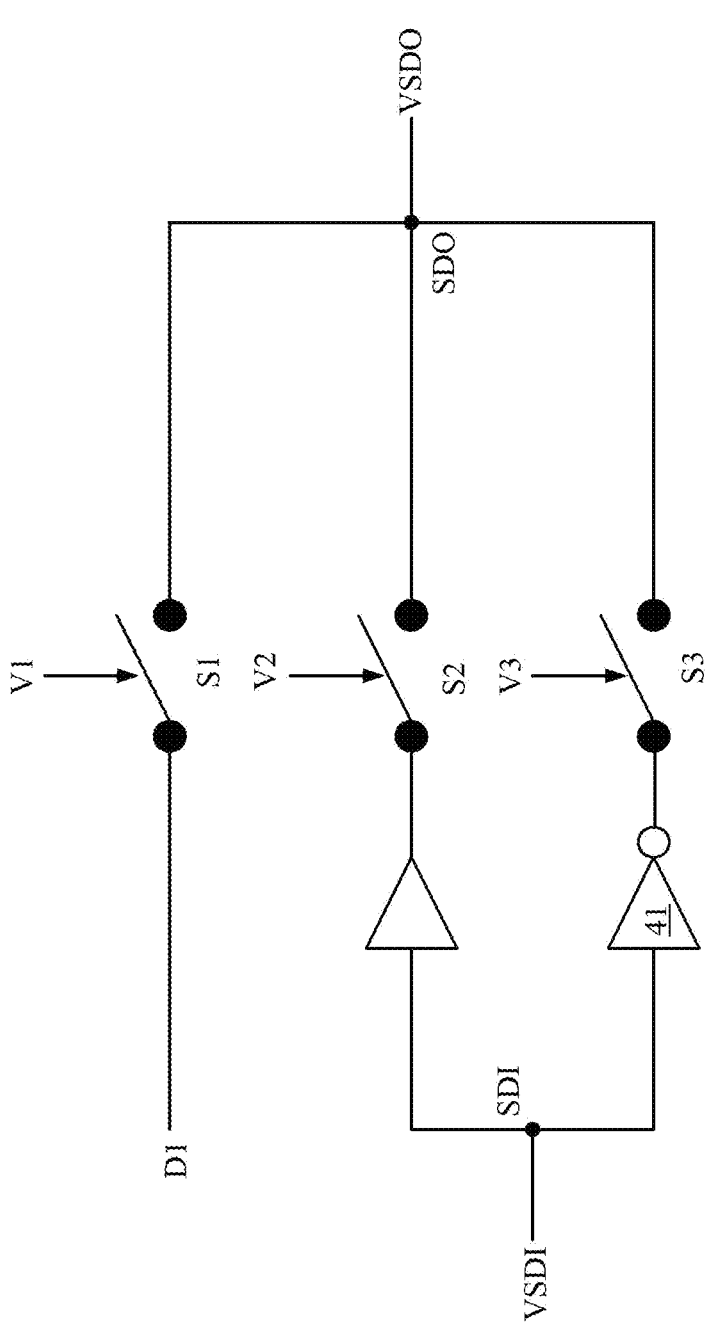
FIG. 4 is a schematic block diagram of a first example synchronous transmission circuit, in accordance with embodiments of the present invention.

Referring now to FIG. 4, shown is a schematic block diagram of a first example synchronous transmission circuit, in accordance with embodiments of the present invention. In this particular example, the synchronous transmission circuit can include switches S1, S2, and S3. Output terminal SDO of the chip may receive signal D1 through switch S1, and input terminal SDI of the chip can be coupled to output terminal SDO of the chip through switch S2 and/or through switch S3 and inverter 41. For example, switch S3 and inverter 41 can be coupled in series between input terminal SDI and output terminal SDO. Optionally, the synchronous transmission circuit can also include a first buffer that can be coupled in series with switch S2 between input terminal SDI and output terminal SDO, in order to enhance driving. In another alternative, the synchronous transmission circuit can include a second buffer that can be coupled in series with switch S3 and inverter 41 between input terminal SDI and output terminal SDO to enhance driving. In another example, inverter 41 can be an inverting buffer to enhance driving.

Figure 5:
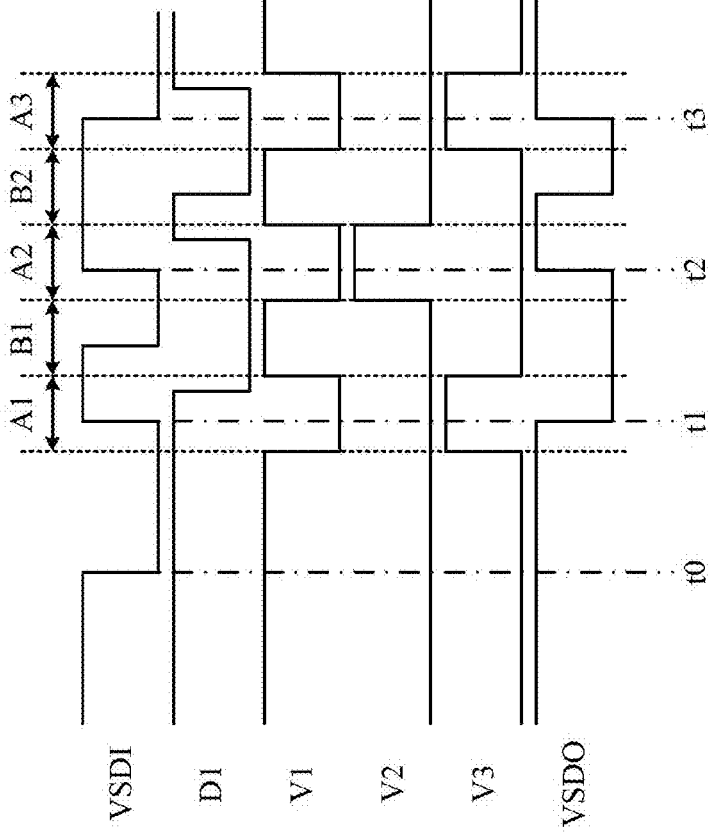
FIG. 5 is a waveform diagram of example operation of the first example synchronous transmission circuit, in accordance with embodiments of the present invention.

Referring now to FIG. 5, shown is a waveform diagram of example operation of the first example synchronous transmission circuit, in accordance with embodiments of the present invention. Here, VSDI represents the input signal, D1 may represent the first signal, VSDO may represent the output signal, Ai may represent the synchronous control interval in an i-th control period, Bi may represent the data control interval in the i-th control period, V1 represents a control signal of switch S1, V2 may represent a control signal of switch S2, and V3 may represent a control signal of switch S3.

The operating process of the example synchronous transmission circuit is described herein with reference to FIGS. 4 and 5. In this particular example, in the synchronous control intervals (e.g., intervals A1, A2 and A3), control signal V1 can be at a low level, and switch S1 turned off. In the data control intervals (e.g., intervals B1 and B2), control signal V1 can be at a high level, and switch S1 turned on, during which time, the levels of output signal SDO and the input signal SDI can be the same.

In the data control intervals (e.g., intervals B1 and B2), control signals V2 and V3 may both be at a low level, and switches S2 and S3 can be turned off. Also, one of the control signals V2 and V3 can be at a high level during the synchronous control intervals (e.g., A1, A2 and A3 intervals), thus causing the switch corresponding to the high-level control signal to be turned on.

Alternatively, before a start moment of each synchronous control interval (e.g., A1, A2 or A3 interval), levels of input signal VSDI and one of signal D1 and output signal VSDO can be sampled. When the level of input signal VSDI is the same as the level of one of signal D1 and output signal VSDO, switch S2 can be turned on and switch S3 turned off in the synchronous control interval. Also, when the level of input signal VSDI is opposite to the level of one of signal D1 and output signal VSDO, switch S3 can be turned on and switch S2 turned off in the synchronous control interval.

Optionally, in each synchronous control interval (e.g., A1, A2 or A3 interval), when a pulse transition of input signal VSDI is the same as a pulse transition of one of signal D1 and output signal VSDO, switch S2 can be turned on and switch S3 turned off in the synchronous control interval. Also, when the pulse transition of input signal VSDI is opposite to the pulse transition of one of signal D1 and output signal VSDO, switch S3 can be turned on and switch S2 turned off in the synchronous control interval.

Figure 6:
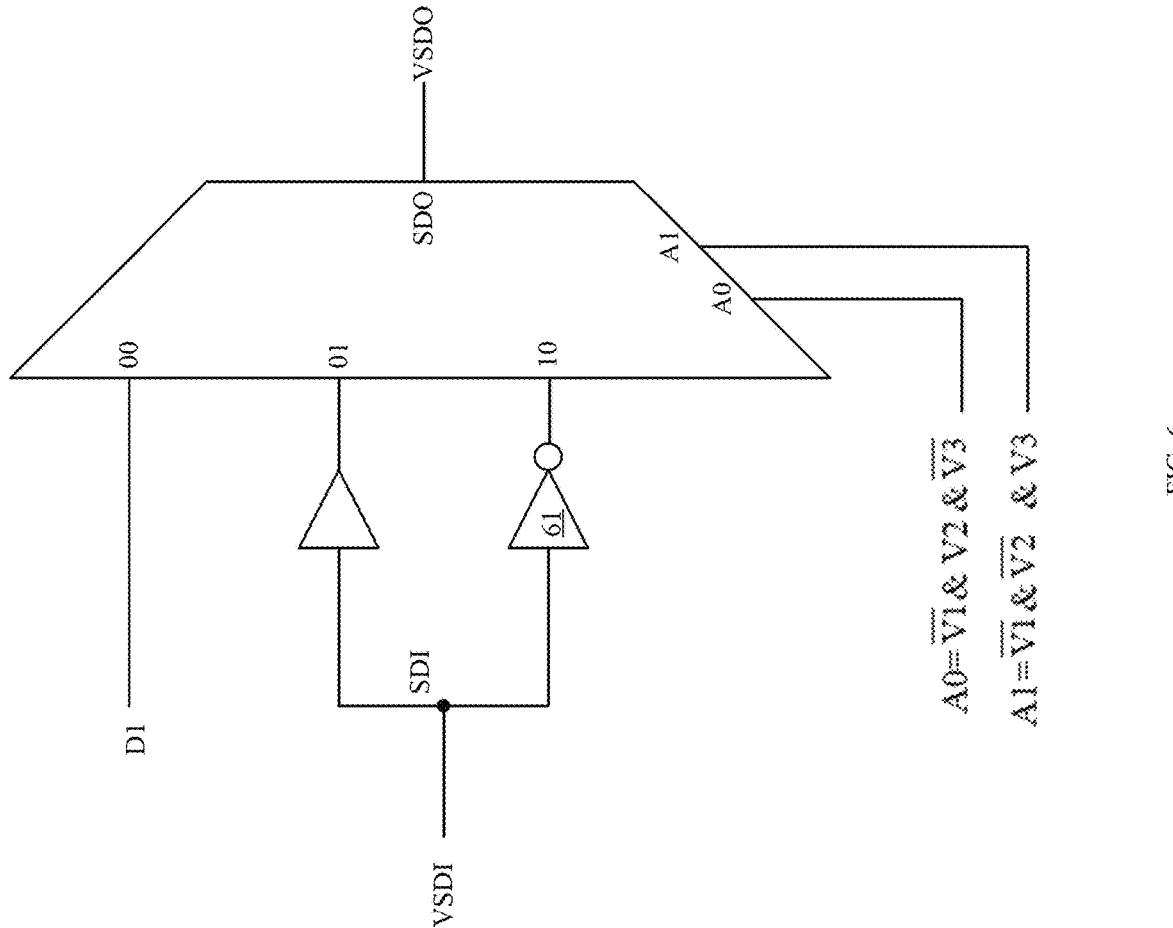
FIG. 6 is a schematic block diagram of a second example synchronous transmission circuit, in accordance with embodiments of the present invention.

Referring now to FIG. 6, shown is a schematic block diagram of a second example synchronous transmission circuit, in accordance with embodiments of the present invention. This particular example communication processing module can include the synchronous transmission circuit, which can include a multiplexer. The multiplexer can include first and second control terminals, an output terminal, and input terminals 00, 01, and 10. For example, input terminal 00 of the multiplexer may receive signal D1, input terminal 01 of the multiplexer can be coupled to input terminal SDI of the chip to receive input signal VSDI, input terminal 10 of the multiplexer can be coupled to input terminal SDI of the chip through an inverter 61 to receive input signal VSDI, the output terminal of the multiplexer can be coupled to output terminal SDO of the chip to generate output signal VSDO, the first control terminal of the multiplexer may receive control signal A1, and the second control terminal of the multiplexer may receive control signal A0. In one example, a buffer can be coupled between input terminal SDI and input terminal 01 to enhance driving. In another example, a buffer is coupled between input terminal SDI and input terminal 10 to enhance driving. For example, inverter 61 can be an inverting buffer to enhance driving.

The multiplexer can selectively transmit the first signal, the input signal, and an inverted signal of the input signal to output terminal SDO of the chip based on control signals A0 and A1. For example, control signal A1 can be a signal obtained by ANDing an inverted signal of control signal V1, an inverted signal of control signal V2, and control signal V3 in FIG. 5; that is, $A1 = V1\_ \& V2\_ \& V3$. Control signal A0 can be a signal obtained by ANDing the inverted signal of control signal V1, control signal V2, and an inverted signal of control signal V3 in FIG. 5; that is, $A0 = V1\_ \& V2 \& V3\_$. When A1A0 is 00, the multiplexer can provide signal D1 as the output signal. When A1A0 is 01, the multiplexer can provide input signal VSDI as the output signal. When A1A0 is 10, the multiplexer can provide the inverted signal of input signal VSDI as the output signal.

Particular embodiments may also provide a synchronous transmission method, which can be applied to a serial communication system that includes slaves and a master coupled in series. The synchronous transmission method can include, in a synchronous control interval of a control period, controlling an output signal of a corresponding slave according to an input signal of the corresponding slave. The synchronous transmission method can also include, in a data control interval of the control period, controlling the output signal of the corresponding slave according to a first signal, to make a period of the output signal be synchronized with a period of the input signal. A start moment of a first period of the first signal can be delayed by a first duration compared to a start moment of a first period of the input signal.

For example, the first duration can be greater than k times the period of the input signal and less than (k+0.5) times the period of the input signal, where k is an integer not less than zero. For example, the first duration can be greater than the period of the input signal and less than 1.5 times the period of the input signal.

Further, each control period can correspond to one period of the input signal. A start moment of each synchronous control interval can be before a start moment of a corresponding period of the input signal, and an end moment of the synchronous control interval may be between the start moment of the corresponding period of the input signal and a middle point of the corresponding period of the input signal. A start moment of each data control interval can be between a start moment of a corresponding period of the input signal and a middle point of the corresponding period of the input signal, and an end moment of the data control interval may be between the middle point of the corresponding period of the input signal and an end moment of the corresponding period of the input signal.

The synchronous control intervals and the data control intervals may alternately be arranged based on a time sequence. In one embodiment, the start moment of each data control interval and the end moment of a corresponding synchronous control interval before the data control interval can be the same. In other examples, the synchronous control interval and the data control interval may be separated by a certain/predetermined period of time.

A level relationship between the output signal and the input signal in the synchronous control interval can be controlled according to levels of the input signal and one of the first signal and the output signal before a start moment of the synchronous control interval. Alternatively, the level relationship between the output signal and the input signal in the synchronous control interval can be controlled according to pulse transitions of the input signal and one of the first signal and the output signal in the synchronous control interval.

In one example, before the start moment of the synchronous control interval, the level of the input signal and the level of the first signal can be sampled. When the level of the input signal is the same as the level of the first signal, the level of the output signal may be the same as the level of the input signal in the synchronous control interval. Also, when the level of the input signal is opposite to the level of the first signal, the level of the output signal can be opposite to the level of the input signal in the synchronous control interval.

In one example, before the start moment of the synchronous control interval, the level of the input signal and the level of the output signal may be sampled. When the level of the input signal is the same as the level of the output signal, the level of the output signal can be the same as the level of the input signal in the synchronous control interval. Also, when the level of the input signal is opposite to the level of the output signal, the level of the output signal can be opposite to the level of the input signal in the synchronous control interval.

In one example, in the synchronous control interval, when the pulse transition of the input signal is the same as the pulse transition of the first signal, the level of the output signal can be the same as the level of the input signal in the synchronous control interval. Also, when the pulse transition of the input signal is opposite to the pulse transition of the first signal, the level of the output signal can be opposite to the level of the input signal in the synchronous control interval.

For example, in the synchronous control interval, when the pulse transition of the input signal is the same as the pulse transition of the output signal, the level of the output signal may be the same as the level of the input signal in the synchronous control interval. Also, when the pulse transition of the input signal is opposite to the pulse transition of the output signal, the level of the output signal may be opposite to the level of the input signal in the synchronous control interval. Further, the level of the output signal can be the same as the level of the first signal in each data control interval.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of synchronous transmission for a serial communication system having a master device and a plurality of slave devices coupled in series, the method comprising:

a) in a synchronous control interval of a control period, controlling an output signal of a corresponding slave according to an input signal of the corresponding slave;

b) in a data control interval of the control period, controlling the output signal of the corresponding slave according to a first signal, such that a period of the output signal is synchronized with a period of the input signal; and c) wherein a start moment of a first period of the first signal is delayed by a first duration compared to a start moment of a first period of the input signal.

2. The method of claim 1, wherein the first duration is greater than k times the period of the input signal and less than (k+0.5) times the period of the input signal, wherein k is an integer not less than zero.

3. The method of claim 1, wherein each of the control periods corresponds to one period of the input signal.

4. The method of claim 3, wherein a start moment of each synchronous control interval is before a start moment of a corresponding period of the input signal, and an end moment of the synchronous control interval is between the start moment of the corresponding period of the input signal and a middle point of the corresponding period of the input signal.

5. The method of claim 3, wherein a start moment of each data control interval is between a start moment of a corresponding period of the input signal and a middle point of the corresponding period of the input signal, and an end moment of the data control interval is between the middle point of the corresponding period of the input signal and an end moment of the corresponding period of the input signal.

6. The method of claim 1, wherein synchronous control intervals and data control intervals of the control periods are alternately arranged based on a time sequence.

7. The method of claim 1, wherein a level relationship between the output signal and the input signal in the synchronous control interval is controlled according to one of:

a) levels of the input signal and one of the first signal and the output signal before a start moment of the synchronous control interval; and b) pulse transitions of the input signal and one of the first signal and the output signal in the synchronous control interval.

8. The method of claim 7, wherein one of:

a) before the start moment of the synchronous control interval, the level of the input signal and the level of one of the first signal and the output signal are sampled, when the level of the input signal is the same as the level of one of the first signal and the output signal, the level of the output signal is the same as the level of the input signal in the synchronous control interval, and when the level of the input signal is opposite to the level of one of the first signal and the output signal, the level of the output signal is opposite to the level of the input signal in the synchronous control interval; and b) in the synchronous control interval, when the pulse transition of the input signal is the same as the pulse transition of one of the first signal and the output signal, the level of the output signal is the same as the level of the input signal in the synchronous control interval, and when the pulse transition of the input signal is opposite to the pulse transition of one of the first signal and the output signal, the level of the output signal is opposite to the level of the input signal in the synchronous control interval.

9. The method of claim 1, wherein a level of the output signal is the same as a level of the first signal in each data control interval.

10. A chip, comprising:

a) an input terminal configured to receive an input signal;

b) an output terminal configured to output an output signal;

c) a communication processing module coupled between the input terminal and the output terminal and configured to generate the output signal;

d) wherein in a synchronous control interval of a control period, the output signal is controlled by the input signal, and in a data control interval of the control period, the output signal is controlled by a first signal, such that a period of the output signal is synchronized with a period of the input signal; and e) wherein a start moment of a first period of the first signal is delayed by a first duration compared to a start moment of a first period of the input signal.

11. The chip of claim 10, wherein the first duration is greater than k times the period of the input signal and less than (k+0.5) times the period of the input signal, where k is an integer and not less than zero.

12. The chip of claim 10, wherein a start moment of each synchronous control interval is before a start moment of a corresponding period of the input signal, and an end moment of the synchronous control interval is between the start moment of the corresponding period of the input signal and a middle point of the corresponding period of the input signal.

13. The chip of claim 10, wherein a start moment of each data control interval is between a start moment of a corresponding period of the input signal and a middle point of the corresponding period of the input signal, and an end moment of the data control interval is between the middle point of the corresponding period of the input signal and an end moment of the corresponding period of the input signal.

14. The chip of claim 10, wherein a level relationship between the output signal and the input signal in the synchronous control interval is controlled according to one of:

a) levels of the input signal and one of the first signal and the output signal before a start moment of the synchronous control interval; and b) pulse transitions of the input signal and one of the first signal and the output signal in the synchronous control interval.

15. The chip of claim 14, wherein one of:

a) before the start moment of the synchronous control interval, the level of the input signal and the level of one of the first signal and the output signal are sampled, when the level of the input signal is the same as the level of one of the first signal and the output signal, the level of the output signal is the same as the level of the input signal in the synchronous control interval, and when the level of the input signal is opposite to the level of one of the first signal and the output signal, the level of the output signal is opposite to the level of the input signal in the synchronous control interval; and b) in the synchronous control interval, when the pulse transition of the input signal is the same as the pulse transition of one of the first signal and the output signal, the level of the output signal is the same as the level of the input signal in the synchronous control interval, and when the pulse transition of the input signal is opposite to the pulse transition of one of the first signal and the output signal, the level of the output signal is opposite to the level of the input signal in the synchronous control interval.

16. The chip of claim 10, wherein a level of the output signal is the same as a level of the first signal in each data control interval.

17. The chip of claim 10, wherein:

a) the communication processing module comprises a synchronous transmission circuit having a first switch, a second switch, and a third switch; and b) the output terminal of the chip receives the first signal through the first switch, and the input terminal of the chip is coupled to the output terminal of the chip through the second switch, and/or through the third switch and an inverter.

18. The chip of claim 17, wherein the first switch is turned off in each synchronous control interval and is turned on in each data control interval, and the second switch and the third switch are selectively turned on in each synchronous control interval, and the second switch and the third switch are turned off in each data control interval.

19. The chip of claim 18, wherein one of:

a) before a start moment of each synchronous control interval, levels of the input signal and one of the first signal and the output signal are sampled, when the level of the input signal is the same as the level of one of the first signal and the output signal, the second switch is turned on and the third switch is turned off in the synchronous control interval, and when the level of the input signal is opposite to the level of one of the first signal and the output signal, the third switch is turned on and the second switch is turned off in the synchronous control interval; and b) wherein in the synchronous control interval, when a pulse transition of the input signal is the same as a pulse transition of one of the first signal and the output signal, the second switch is turned on and the third switch is turned off in the synchronous control interval, and when the pulse transition of the input signal is opposite to the pulse transition of one of the first signal and the output signal, the third switch is turned on and the second switch is turned off in the synchronous control interval.

20. The chip of claim 10, wherein the communication processing module comprises a synchronous transmission circuit having a multiplexer, wherein a first input terminal of the multiplexer receives the first signal, a second input terminal of the multiplexer is coupled to the input terminal of the chip, a third input terminal of the multiplexer is coupled to the input terminal of the chip through an inverter, an output terminal of the multiplexer is coupled to the output terminal of the chip, a first control terminal of the multiplexer receives a first control signal, and a second control terminal of the multiplexer receives a second control signal.

* * * * *